United States Patent [19]

Kaufman

[11] 4,394,530
[45] Jul. 19, 1983

[54] POWER SWITCHING DEVICE HAVING IMPROVED HEAT DISSIPATION MEANS

[76] Inventor: Lance R. Kaufman, 1821 W. Daisy La., Milwaukee, Wis. 53209

[21] Appl. No.: 834,601

[22] Filed: Sep. 19, 1977

[51] Int. Cl.³ .............................................. H01L 23/36
[52] U.S. Cl. ................................. 174/16 HS; 29/843; 357/81; 361/388
[58] Field of Search .......... 174/52 FP, 52 PE, 16 HS; 339/17 R, 17 B, 17 C, 17 CF; 361/386, 388, 389; 29/628; 357/81

[56] References Cited

U.S. PATENT DOCUMENTS

| | | | |
|---|---|---|---|
| 3,377,524 | 4/1968 | Bock et al. | 174/16 HS X |
| 3,801,728 | 4/1974 | Gallo et al. | 174/52 FP |
| 3,825,767 | 7/1974 | Shields | 174/52 PE X |
| 3,958,075 | 5/1976 | Kaufman | 174/16 HS |
| 4,038,678 | 7/1977 | Gottbreht et al. | 361/388 X |
| 4,069,497 | 1/1978 | Steidlitz | 357/81 X |
| 4,092,697 | 5/1978 | Spaight | 357/81 X |

FOREIGN PATENT DOCUMENTS 1007529 10/1965 United Kingdom ........... 174/16 HS

Primary Examiner—A. T. Grimley
Assistant Examiner—D. A. Tone
Attorney, Agent, or Firm—Andrus, Sceales, Starke & Sawall

[57] ABSTRACT

A insulating housing has a recess in which a ceramic substrate is inserted for the first side of the substrate to be inside of the recess and the second side to be exposed and to extend outwardly from the recess slightly beyond the bottom surface of the housing. Clamping the housing against a heat sink compresses the second side of the substrate against the heat sink to enhance heat transfer by reason of the number of junctions or interfaces being minimized. Electric circuit means are disposed on the first side of the substrate and at least one heat generating electric component is in the circuit. A new method and means for connecting leads to the lead frame which is adhered to the substrate is disclosed.

6 Claims, 10 Drawing Figures

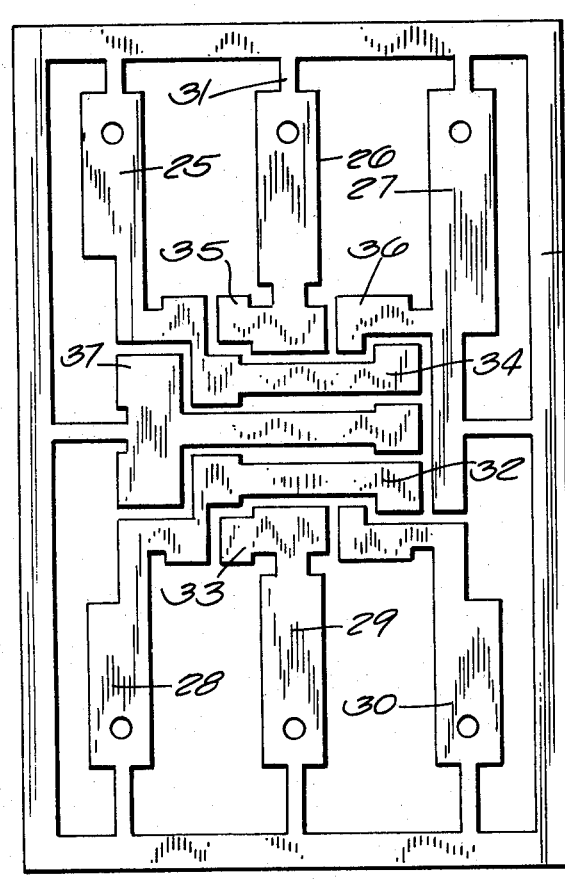
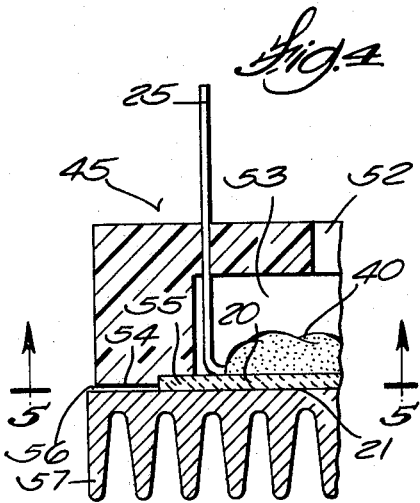
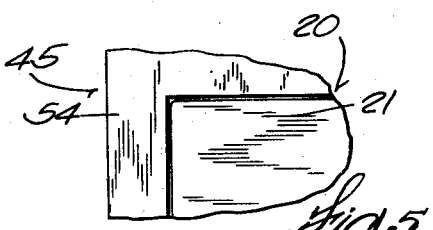
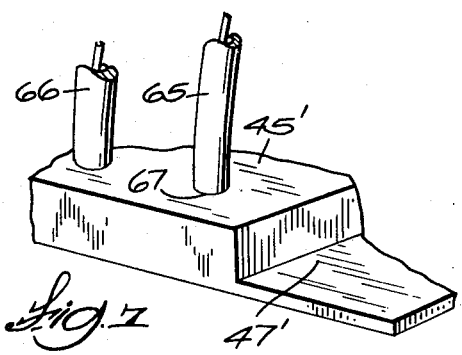
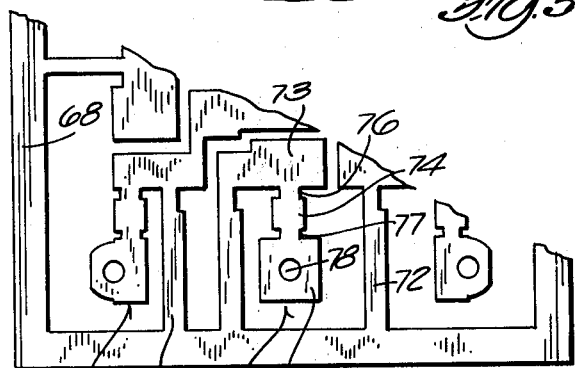
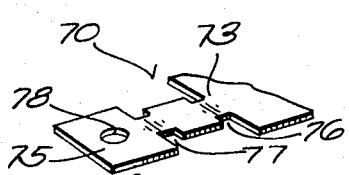
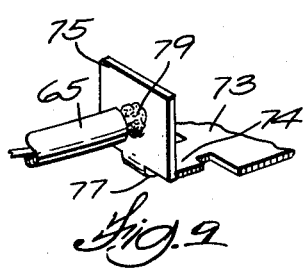
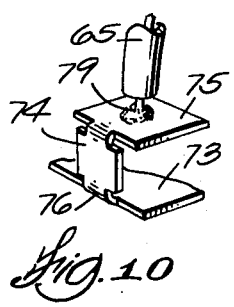

POWER SWITCHING DEVICE HAVING IMPROVED HEAT DISSIPATION MEANS

BACKGROUND OF THE INVENTION

This invention relates primarily to power switching devices such as solid state relays and power bridge circuits which have a relatively high current power switching circuit under the control of an isolated relatively low current and voltage control circuit.

Typical power switching devices are characterized as hybrid circuits in which conductive films and usually resistance elements are deposited on a flat ceramic substrate plate and a lead frame is adhered to the film conductors. Active circuit components such as triacs and silicon controlled rectifiers are mounted on strips which comprise the lead frame. A typical power switching device of this character may be seen in U.S. Pat. No. 3,958,075 which is owned by the assignee of this invention. As is known, a thin film soldering material is applied to the interfaces between components on the substrate before assembly and, after assembly, the substrate with the components mounted thereon is heated to cause the solder to reflow and bond the parts together. Usually the outside surface of the ceramic substrate is bonded at the same time to a rather massive metal plate which has bolt holes which enable pressing the assembly against the surface of a heat sink. Metallization and solder layers in combination with the base plate result in a large number of interfaces or junctions which impede transfer of heat from the substrate to the heat sink. Every junction produces a significant reduction in heat transfer ability which, in the last analysis, requires the manufacturer to specify lower current ratings for the devices than would be necessary if better heat dissipation could be obtained.

Continuing with the description of the prior art structure, after the metal base plate and substrate are joined by reflowing, the device is placed in an appropriate mold of an injection molding machine and it is encapsulated, often in epoxy resin, to form a unitary device from which terminals for making external connections project.

When a user mounts a device of this type on a heat sink, it is usually done by clamping the base plate to the heat sink with machine bolts or screws. The base plate is pulled down tightly with the bolts in an effort to cause the base plate and heat sink surface areas to be in overall contact. Higher compressive force, of course, improves heat exchange between the bottom of the base plate and the surface of the heat sink. In this prior type of device, however, regardless of the compressive force developed at the junction or interface of the base plate bottom and the heat sink, no additional compressive force is transmitted back to the other junctions or interfaces so that their heat transfer ability is not enhanced beyond that which is an inherent result of the method of manufacture.

SUMMARY OF THE INVENTION

A general object of the present invention is to provide a solid state switching device which overcomes the disadvantages noted above and which has high heat dissipating ability.

Another object is to provide a device wherein the substrate on which the circuit components are mounted is held in a housing such that one surface of the substrate is exposed and extends by a minor amount out of the housing so that when the housing is clamped to a heat sink the substrate will be in direct heat exchange contact with the heat sink surface and the number of junctions will be minimized.

Still another object is to provide in a device of the character described a new lead frame configuration which facilitates a new method of fastening the leads to the lead frame.

Yet another object is to obtain good heat interchange or thermal contact between the whole surface areas of the substrate and heat sink by providing a thin elastomeric film which is impregnated with heat conducting particles for being interposed between the substrate and heat sink to fill in even microscopic voids and irregularities which might impede heat transfer.

How the foregoing and other more specific objects of the invention are achieved will appear in the more detailed description of embodiments of the invention which will now be set forth in reference to the drawings.

DESCRIPTION OF THE DRAWINGS

FIG. 3 is an isolated plan view of a typical lead frame prior to it being assembled in a power control device;

FIG. 4 is a fragmentary vertical section of the new device mounted on a heat sink which is also shown fragmentarily;

FIG. 5 is a bottom view of the device looking in the direction of the arrows 5—5 in FIG. 4;

FIG. 6 is a fragmentary plan view of another type of lead frame for use in an alternative embodiment of the power control device;

FIG. 7 shows a fragment of the device housing with external leads extending for the alternative embodiment; and FIGS. 8-10 show a lead frame terminal extension in various stages in the sequence of attaching a lead thereto.

DESCRIPTION OF A PREFERRED EMBODIMENT

Figures 1, 2:
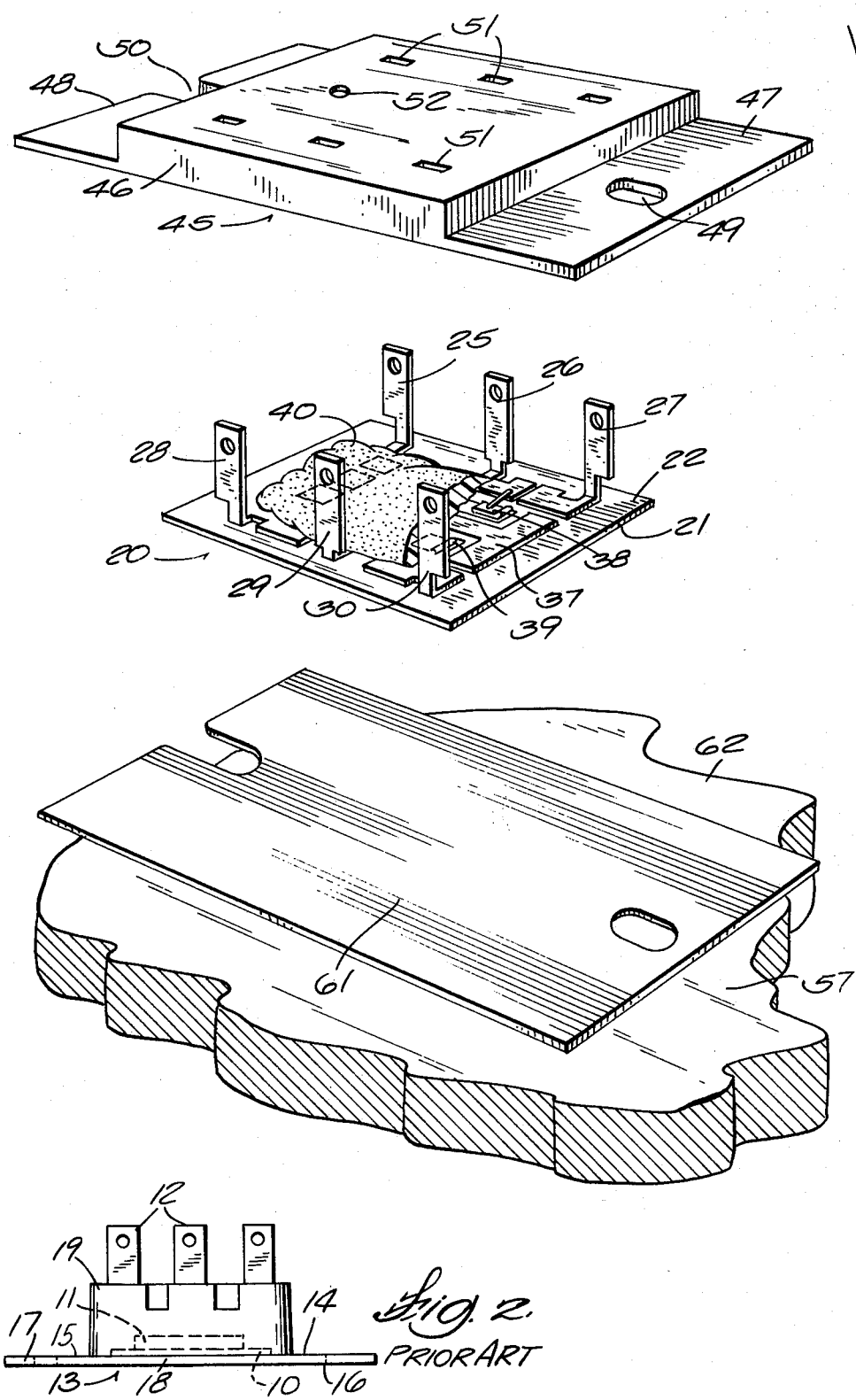
FIG. 1 is an exploded view of a power control device made in accordance with the invention in combination with a heat sink that is shown fragmentarily.
FIG. 2 is an elevation view of a power control device made in accordance with prior art practices.

First refer to FIG. 2 for a discussion of the manner in which heat dissipation is impeded in prior art devices such as the one that is illustrated. Typical of this prior art device is the use of a ceramic substrate plate which is usually rectangular in form and between 1/32 and 1/16 of an inch thick. The substrate is marked 10 and is shown in dashed lines. A thick film circuit, a lead frame and a heat generating electric circuit component are all symbolized by the rectangular dashed line block 11. Circuit elements 11 are understood to be adhered to the top surface of substrate 10. Terminal prongs such as the one marked 12 are understood to extend up from the lead frame. These are for making external connections to the power control device. The bottom surface of substrate 10 interfaces with the top surface of a metal plate, usually copper alloy, marked 13. This plate has laterally extending flange portions 14 and 15. Flange 14 has an endwise slot 16 and flange 15 has a hole 17 through which bolts or machine screws may be passed for compressing the bottom surface of plate 13 against a heat sink surface, not shown.

It will be understood that at the interface between the bottom surface of substrate 10 and the top surface of plate 13 such as in the region marked 18 there is a thin metallized film on the bottom of the substrate and a thin layer of solder between this film and the top surface of metal plate 13. Thus, there are interfaces or heat exchanging junctions between ceramic substrate 10 and the metallized film, between the film and the solder and between the solder and the top surface of plate 13. Moreover, when plate 13 is compressed against a heat sink, there is another junction between its bottom surface and the heat sink. As implied earlier, although these junctions are in intimate contact, they nevertheless each add to the impedance of heat flow from the ceramic to the heat sink. When the assembly just discussed is completed, that is, after the solder which bonded together is reflowed, it is put in a mold, not shown, and potted or encapsulated with resin to form the insulating body 19.

A power control device having improved heat dissipating qualities, in accordance with the invention, will now be discussed in reference to FIGS. 1 and 3-5 after which another embodiment will be described in reference to FIGS. 6-10.

The power control device shown in FIG. 1 comprises a substrate 20 which is preferably made of a material which is electrically insulating and thermally conductive such as a ceramic material. The substrate in this case is a rectangular ceramic plate which has a planar bottom first side 21 and a top or opposed second side 22. In the process of making the assembly, metallization is deposited on the substrate second surface 22 along with printed resistors if any are used in the circuitry. A copper alloy lead frame such as the one shown in FIG. 3 is then superimposed over the metallization pattern. Chips such as capacitors, transistors, diodes, triacs or silicon controlled rectifiers are placed onto the circuit. Since a solder film has already been applied to the interfacing components, the device may be reflowed so that all electrical connections occur in one operation.

The lead frame used in the FIG. 1 embodiment is depicted in FIG. 3. It is stamped from a thin copper alloy sheet, typically about 0.020 of an inch thick. The lead frame is generally designated by the reference numeral 23. It has a frame 24 which is eventually cut off of the lead frame after it is bonded to the substrate. The lead frame has six terminal strips 25-30 which are initially secured to frame 24 by webs such as the one marked 31. These webs are cut eventually so that the terminal strips 25-30 may be bent upwardly as shown in FIG. 1. The terminal strips in FIG. 3 extend to additional conductive strips such as those marked 32-36. These strips are superimposed over metallization on the top surface 22 of ceramic substrate 20 and are bonded to the substrate during the reflow step. Some of the conductive strips of the lead frame such as the one marked 37 simply serve as conductors on which electric circuit components may be connected.

In FIG. 1, two heat generating circuit components 38 and 39 are visible and are shown as being connected between conductive strips of the lead frame. It will be understood that other electric components such as resistors, capacitors and diodes may also be connected in the circuit paths defined by the conductive lead frame strips. Typically, the lead frame strips will be bonded by reflowing to a thick film layer which has been previously deposited on the top surface 22 of substrate 20 as described in cited U.S. Pat. No. 3,958,075. The electric circuit components are preferably coated with insulating compound 40 which may be self-curing silicon sealant.

The structure and methodology thus far described is conventional in respect to solid state power control devices. Now, however, the unconventional manner in which the ceramic substrate 20 and the electric circuit components thereon is housed so as to enable the substrate to be disposed in improved heat exchange relationship with a heat sink will be discussed. After the lead frame margin 24 is cut off, the terminal prongs 25-30 are turned up to enable ceramic substrate 20 to be inserted in a housing which is generally designated by the reference numeral 45 in FIG. 1. The housing is premolded, preferably of a thermosetting resin. It comprises a central body 46 from which integral flanges 47 and 48 extend. Flange 47 has a hole 49 and flange 48 has a slot 50 which accommodate bolts or machine screws by means of which housing 45 is clamped against a heat sink. Body 46 has slots such as the one marked 51 through which terminal prongs such as the one marked 25 may project after the substrate is inserted into the housing. A small hole 52 is provided in the top of the housing to enable injection of an insulating compound within the housing and over the top of the circuitry on the substrate if desired.

A fragmentary section of housing 45 is shown in FIG. 4 where it is evident that the housing has a suitable recess 53 for accommodating the circuit components on top of substrate 20. The lower surface 54 of the housing is further recessed to provide a shoulder 55 which constitutes a means for limiting the depth of entry of the substrate into the recess 53. In accordance with the invention, the first or bottom planar surface 21 of the substrate extends out of the recess and beyond the planar bottom surface 54 of the housing by a minor amount which is manifested by the gap 56 between the bottom surface 54 of the housing and the top surface of a heat sink which is generally designated by the reference numeral 57. The amount by which the bottom surface 21 of substrate 20 projects beyond bottom surface 54 of the housing is somewhere between being flush and an extension of about 0.002 of an inch. An extension of about 0.001 of an inch is used in a commercial embodiment and has been found to be satisfactory. When the housing is clamped to a heat sink using screws through flanges 47 and 48 ceramic substrate 20 is forced into compression with the heat sink due to the reaction of shoulder 55 in the body recess. Thus, the new construction not only allows direct contact and enhanced heat transfer between substrate 20 and heat sink 57, but it results in reduced cost to the user by virtue of elimination of a base plate such as the one marked 13 in FIG. 2 which was discussed earlier.

Although the bottom surface 21 of substrate 20 and the top surface of heat sink 57 are nominally planar and smooth, microscopic irregularities are always present. These irregularities result in a multitude of point contacts between the surfaces as opposed to total area contact which is theoretically desirable. Hence, a user may want to apply a coat of silicone grease at the interface of the substrate and heat sink to further enhance heat transfer. This practice is well known in the electronics arts, of course.

An improved way of compensating for surface irregularities and voids to thereby enhance heat transfer between the substrate and heat sink involves the use of a film or thin sheet which is marked 61 in FIG. 1. Sheet 61 is comprised of elastomeric material which is impregnated with extremely fine ceramic particles. This material has good heat conducting properties. The sheet is used by interposing it between the bottom surface 21 of substrate 20 and the top surface 62 of heat sink 57 which is shown fragmentarily in FIG. 1. When the sheet is compressed by tightening down on flanges 47 and 48 of the housing, the voids and irregularities are impressed in the sheet and total area contact between the substrate and heat sink results. The elastomeric sheet is on the order of 0.007 of an inch thick although it may be thicker or thinner depending on the nature of the irregularities which are being compensated. The elastomeric sheet 61 can be provided with a pressure sensitive adhesive on one face so that it is convenient to adhere to the bottom surface of the substrate as the last step in the manufacture of the device.

Additional features of the new direct contact power control device will now be discussed in reference to the FIGS. 6-10 embodiment. As shown in FIG. 7, a feature of this embodiment is the use of insulated leads such as those marked 65 and 66 for making the external electrical connections to the circuitry on the substrate in housing 45'. Except for the fact that housing 45' has round holes 67 in its top for the leads to pass through as compared with slots 51 in housing 45 through which terminal prongs pass through, the housing and the illustrative solid state power control circuitry within them may be identical. Of course, a variety of different circuits may be used in either of the housings in connection with the direct contact substrate construction.

The lead frame 68 shown in FIG. 6 is adapted for the FIG. 7 embodiment wherein external leads such as 65 and 66 are used. Two typical lead frame terminal strips to which the leads are finally connected are marked 69 and 70. Holding strips such as those marked 71 and 72 are eventually cut to allow removal of the lead frame border after the device has been reflowed.

A typical terminal strip 70 extends from a lead frame strip portion such as the one marked 73 which is bonded to the substrate. The extending portion of the strip has two discrete parts 74 and 75 which are coplanar with each other and with strip portion 73 before the lead wire connecting process is begun. There are notches 76 between parts 74 and 73 and notches 77 between parts 74 and 75. These notches control the lines on which the parts will bend relative to each other subsequently in the sequence of operations involving connecting the lead wires. Part 75 has a hole 78 through which the strip end of the insulated lead wire is inserted.

FIGS. 8-10 show one of the terminal strip extensions 70 isolated to facilitate describing the steps involved in connecting the lead wires to the lead frame. In FIG. 8, parts 73-75 are coplanar. To connect the lead such as 65 part 75 is bent on a line across notches 77 to dispose this part substantially normal to the plane of part 74. The lead wire 65, having its end bared, is then inserted through hole 78 in part 75 and solder 79 is applied to secure the lead in part 75. As can be seen in FIG. 9, when part 75 is bent perpendicularly easy access is provided to both sides of this part to enable the soldering operation. The solder is actually applied to the tip of the conductor on the far side of part 75 as viewed in FIG. 9 but it flows through hole 78 to create the deposit which is marked 79. The next step, as shown in FIG. 10, is to bend part 74 on the line defined by notches 76 such that part 74 is normal to part 75 and bonded lead frame part 73. Parts 73 and 75 are then in parallelism and the lead 65 is perpendicular to the plane of part 75. When similar steps have been carried out for each of the lead frame terminal extensions, all of the conductors are standing upright. The suitably perforated housing 45' is then passed over the upstanding leads and the ceramic substrate is pressed into the recess similar to the previously discussed embodiment.

Although it is not illustrated, it will be understood that part 75 and corresponding parts on the other terminal strips will lie immediately under the top of the housing so that the part will be stopped by the housing and will act as a strain relief to absorb any stress that is imposed on the lead wires without the stress being transferred to the lead frame portion 73 which is bonded to the substrate. Thus, convenient attachment of the leads and strain relief are both achieved.

Although a particular style of power control device has been used to demonstrate the new heat transfer enhancement and lead attachment techniques, such description should be considered illustrative rather than limiting, for the invention may be variously embodied and is to be limited only by interpretation of the claims which follow.

I claim:

1. A power control assembly, comprising a solid state device including a heat generating portion, an electrically insulating thermally conductive substrate having a first side operatively connected in heat transfer relation to said heat generating solid state portion, a heat sink having an outer surface abutting a second substrate side spaced from said first side for dissipating heat from said solid state device, an electrically insulating housing having a first side including an outer wall surrounding an opening providing a recessed inner wall spaced from said outer wall with said substrate enclosing said opening and spaced from said inner wall to form a cavity about said solid state device, said inner wall including a terminal opening extending from said cavity to a second side of said housing, means for mechanically clamping said substrate to said heat sink, and electrical conductor means including a first conductive portion attached for electrical connection to said solid state device, said first conductive portion includes a thin bendable terminal strip portion extending from a conductive strip adhered to said first substrate side, said terminal strip portion including first and second parts with said first part substantially normally connected to said conductive strip and said second part substantially normally connected to said first part, and a second conductive portion extending through said terminal opening and including a conductive lead wire having a bare end soldered to said second part, said second conductive portion disposed within said terminal opening and maintained substantially normal to said substrate and providing external electrical access to said solid state device.

2. The assembly of claim 1 wherein said second part engages said inner housing wall for preventing stress from being transmitted from said wire to said substrate.

3. The assembly of claim 1 wherein said terminal strip portion provides notches between said first and second parts for controlling the lines on which said portions bend.

4. A power control assembly, comprising a solid state device including a heat generating portion, an electrically insulating thermally conductive substrate having a first side operatively connected in heat transfer relation to said heat generating solid state portion, a heat sink having an outer surface abutting a second substrate side spaced from said first side for dissipating heat from said solid state device, an electrically insulating housing having a first side including an outer wall surrounding an opening providing a recessed inner wall spaced from said outer wall with said substrate enclosing said opening and spaced from said inner wall to form a cavity about said solid state device, said inner wall including a terminal opening extending from said cavity to a second side of said housing, means for mechanically clamping said substrate to said heat sink without subjecting said solid state device to compressive forces, and electrical conductor means including a first conductive portion attached for electrical connection to said solid state device and including a bendable terminal strip including a first part substantially normal to said substrate and a second part connected to the first part and generally normal to said first part and parallel to said substrate and a second conductive portion extending through said terminal opening and providing external electrical access to said solid state device and including a lead wire attached to and soldered to said second part.

5. A method of attaching lead wires to a power control device whose major parts are a ceramic substrate on which electric circuit means are adhered and an insulating housing for said substrate, which device is preliminarily fabricated to the extent of having conductive film bands bonded to said substrate and a lead frame comprised of thin sheet metal strips bonded to selected bands and having electric circuit components connected to selected ones of the strips to form an electric circuit mounted to said substrate, said method including the steps of:

providing said lead frame with thin strips that extend laterally from and substantially coplanar with the lead frame after preliminary fabrication, which strips have first and second parts, the first of which is nearest to the lead frame, bending said strip part on a line intermediate said first and second strip parts such that said second part is generally normal to said first part, soldering the end of a lead wire to each of said second parts and bending said first part on a line intermediate said first part and said lead frame to thereby dispose said first part generally normal to said lead frame and said lead wires generally normal to said second part, then inserting said substrate with lead wires attached into a recess in the bottom of said housing such that said lead wires extend through openings in said housing and the bottom of said substrate is exposed.

6. The method as in claim 5 including the additional step of injecting settable fluid insulating material into said recess after said substrate is inserted into said housing.

* * * * *